(12) United States Patent
Hsieh et al.

(10) Patent No.: US 9,000,569 B2
(45) Date of Patent: Apr. 7, 2015

(54) SEMICONDUCTOR STRUCTURE

(71) Applicant: Chipbond Technology Corporation, Hsinchu (TW)

(72) Inventors: Chin-Tang Hsieh, Kaohsiung (TW); You-Ming Hsu, Kaohsiung (TW); Ming-Sheng Liu, Hsinchu (TW); Chih-Ping Wang, Hsinchu County (TW)

(73) Assignee: Chipbond Technology Corporation, Hsinchu (TW)

( * ) Notice: Subject to any disclaimer, the term of this patent is extended or adjusted under 35 U.S.C. 154(b) by 88 days.

(21) Appl. No.: 14/042,976

(22) Filed: Oct. 1, 2013

(65) Prior Publication Data

US 2015/0069584 A1    Mar. 12, 2015

(30) Foreign Application Priority Data

Sep. 10, 2013   (TW) .............................. 102132529 A

(51) Int. Cl.
H01L 21/4763 (2006.01)
H01L 23/00 (2006.01)
H01L 23/28 (2006.01)
H01L 23/532 (2006.01)
H01L 23/31 (2006.01)

(52) U.S. Cl.
CPC .............. *H01L 23/562* (2013.01); *H01L 23/28* (2013.01); *H01L 23/53295* (2013.01); *H01L 23/3192* (2013.01)

(58) Field of Classification Search
None
See application file for complete search history.

(56) References Cited

U.S. PATENT DOCUMENTS

2008/0073784 A1 *  3/2008  Lee ................................ 257/738
2010/0207281 A1 *  8/2010  Su et al. ........................ 257/786

* cited by examiner

*Primary Examiner* — Davienne Monbleau
*Assistant Examiner* — Shaka White
(74) *Attorney, Agent, or Firm* — Jackson IPG PLLC

(57) ABSTRACT

A semiconductor structure includes a carrier, a first protective layer, a second protective layer, and a third protective layer. A first surface of the first protective layer comprises a first anti-stress zone. A first extension line from a first bottom edge intersects with a second extension line from a second bottom edge to form a first base point. A first projection line is formed on the first surface, an extension line of the first projection line intersects with the second bottom edge to form a first intersection point, a second projection line is formed on the first surface, and an extension line of the second projection line intersects with the first bottom edge to form a second intersection point. A zone by connecting the first base point, the first intersection point and the second intersection point is the first anti-stress zone.

7 Claims, 6 Drawing Sheets

SEMICONDUCTOR STRUCTURE

FIELD OF THE INVENTION

The present invention is generally related to a semiconductor structure, which particularly relates to the semiconductor structure with an anti-stress zone.

BACKGROUND OF THE INVENTION

A conventional semiconductor structure 200 illustrated in FIG. 6 comprises a carrier 210, a first protective layer 220, a second protective layer 230 and a third protective layer 240. The shape of the first protective layer 220, the second protective layer 230 and the third protective layer 240 is quadrangle. Besides, the first protective layer 220, the second protective layer 230 and the third protective layer 240 are disposed at the carrier 210 and arranged in a layer-by-layer stack. For mentioned features of those protective layers, the stress of the semiconductor structure 200 likely concentrates at a corner that is overlapped between the first protective layer 220 and the second protective layer 230 such that the corner might be cracked or separated therefore lowering the production yield of the semiconductor structure 200.

SUMMARY

The primary object of the present invention is to provide a semiconductor structure. A first anti-stress zone of a first surface of a first protective layer prevents the stress from concentrating at a corner to avoid cracks or separations occurred in the semiconductor structure.

A semiconductor structure having at least one corner includes a carrier, a first protective layer, a second protective layer and a third protective layer. The carrier comprises a carrier surface having a protection-layered disposing zone and a protection-layered exposing zone located outside the protection-layered disposing zone. The first protective layer is disposed on the protection-layered disposing zone and comprises a first surface having a first disposing zone, at least one first anti-stress zone and a first exposing zone located outside the first disposing zone and the at least one first anti-stress zone. The at least one first anti-stress is located at the at least one corner. The second protective layer is disposed at the first disposing area and reveals the at least one first anti-stress zone and the first exposing zone. The second protective layer comprises a second surface, a first lateral surface and a second lateral surface, wherein the second surface comprises a second disposing zone and a second exposing zone located outside the second disposing zone. The first lateral surface comprises a first bottom edge, wherein the second lateral surface comprises a second bottom edge, and a first extension line extendedly formed from the first bottom edge intersects with a second extension line extendedly formed from the second bottom edge to form a first base point. The third protective layer is disposed at the second disposing zone and comprises a third lateral surface and a fourth lateral surface, the third lateral surface comprises a third bottom edge, and the fourth lateral surface comprises a fourth bottom edge. The third bottom edge is projected on the first surface of the first protective layer to form a first projection line situated on the first surface, and an extension line of the first projection line intersects with the second bottom edge of the second lateral surface to form a first intersection point. The fourth bottom edge is projected on the first surface of the first protective layer to form a second projection line situated on the first surface, and an extension line of the second projection line intersects with the first bottom edge of the first lateral surface to form a second intersection point. A zone formed by connecting the first base point, the first intersection point and the second intersection point is the at least one first anti-stress zone. Via the at least one first anti-stress zone formed by connecting the first base point, the first intersection point and the second intersection point, the stress of the semiconductor structure does not concentrate at the at least one corner to prevent the at least one corner from cracks or separations.

DETAILED DESCRIPTION OF THE INVENTION

Figure 1:
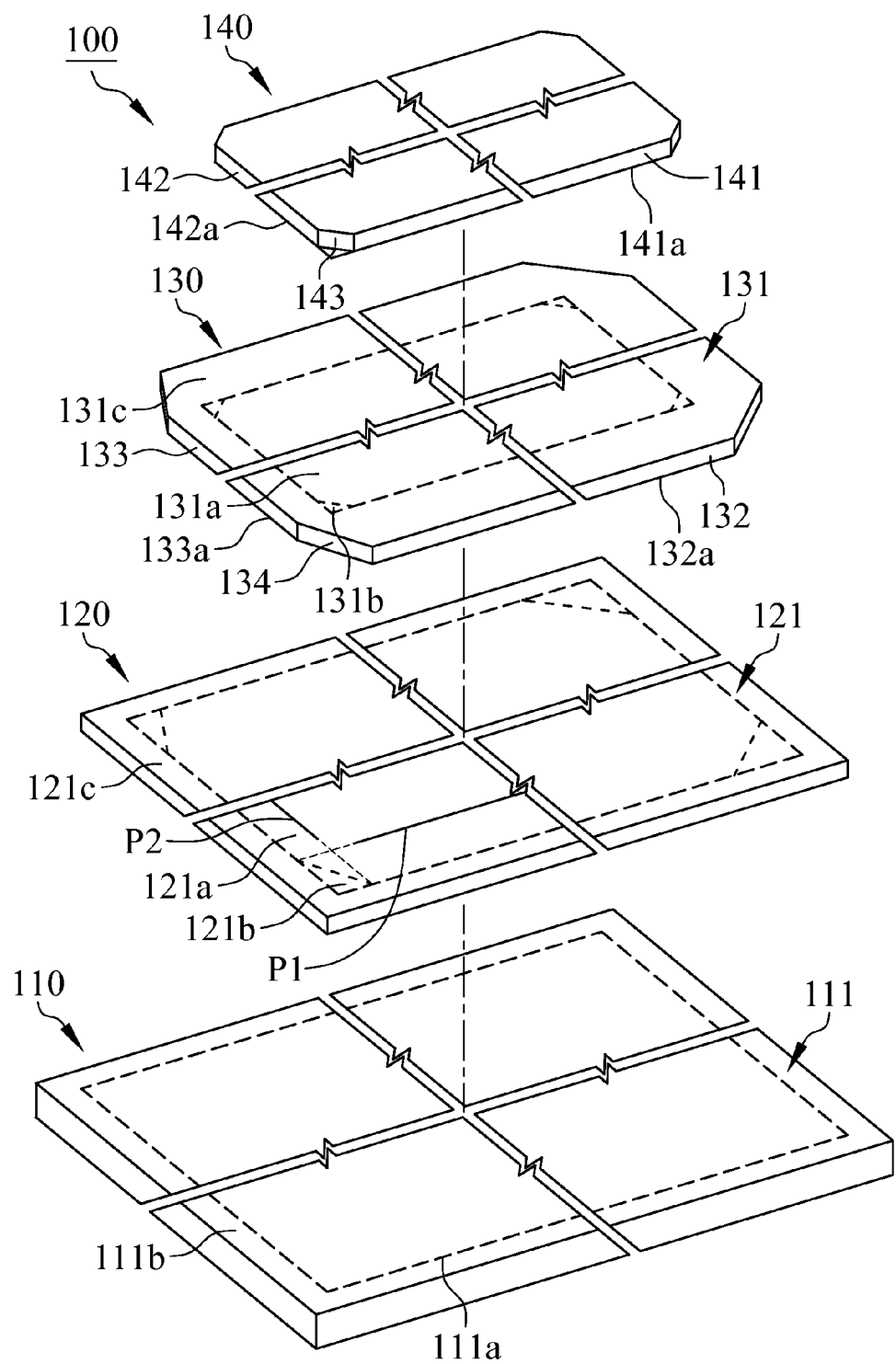
FIG. 1 is a perspective exploded view illustrating a semiconductor structure in accordance with a first embodiment of the present invention.
Figure 2:
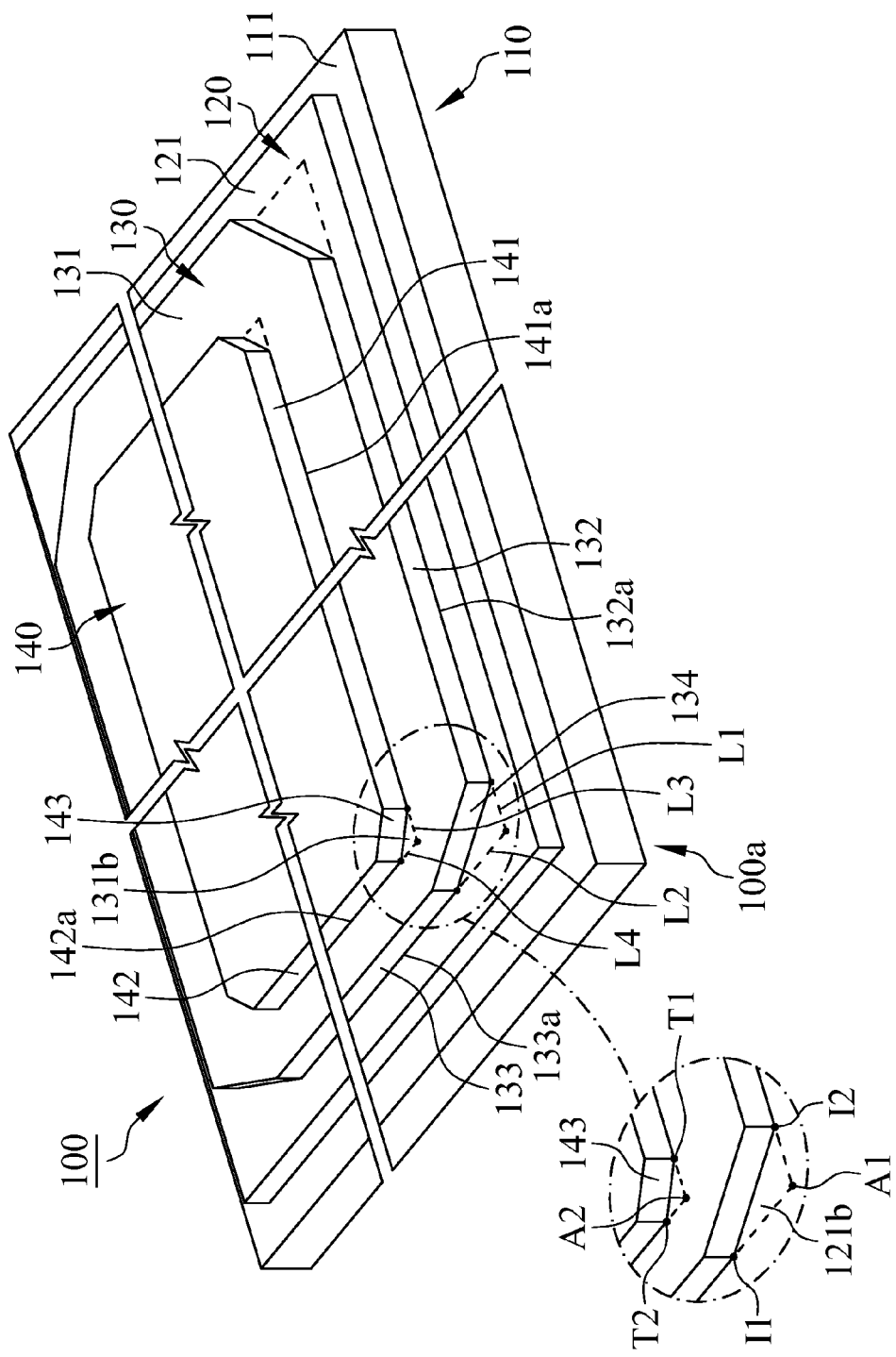
FIG. 2 is a perspective view illustrating the semiconductor structure in accordance with the first embodiment of the present invention.

With reference to FIGS. 1 and 2, a semiconductor structure 100 having at least one corner 100a in accordance with a first embodiment of the present invention includes a carrier 110, a first protective layer 120, a second protective layer 130, and a third protective layer 140. The carrier 110 comprises a carrier surface 111 having a protection-layered disposing zone 111a and a protection-layered exposing zone 111b located outside the protection-layered disposing zone 111a. The first protective layer 120 is disposed at the protection-layered disposing zone 111a and comprises a first surface 121 having a first disposing zone 121a, at least one first anti-stress zone 121b and a first exposing zone 121c located outside the first disposing zone 121a and the at least one first anti-stress zone 121b. The at least one first anti-stress zone 121b is located at the at least one corner 100a of the semiconductor structure 100. The second protective layer 130 is disposed at the first disposing zone 121a and reveals the at least one first anti-stress zone 121b and the first exposing zone 121c, and the second protective layer 130 comprises a second surface 131, a first lateral surface 132, a second lateral surface 133 and a connection surface 134 connected to the first lateral surface 132 and the second lateral surface 133. The second surface 131 comprises a second disposing zone 131a, at least one second anti-stress zone 131b and a second exposing zone 131c located outside the second disposing zone 131a and the at least one second anti-stress zone 131b. The at least one second anti-stress area 131b is located at a corner of the second disposing area 131a. The at least one second anti-stress zone 131b and the at least one first anti-stress zone 121b are both located at the at least one corner 100a of the semiconductor structure 100. In this embodiment, the area of the at least one first anti-stress zone 121b is not smaller than that of the at least one second anti-stress zone 131b.

Figure 3:
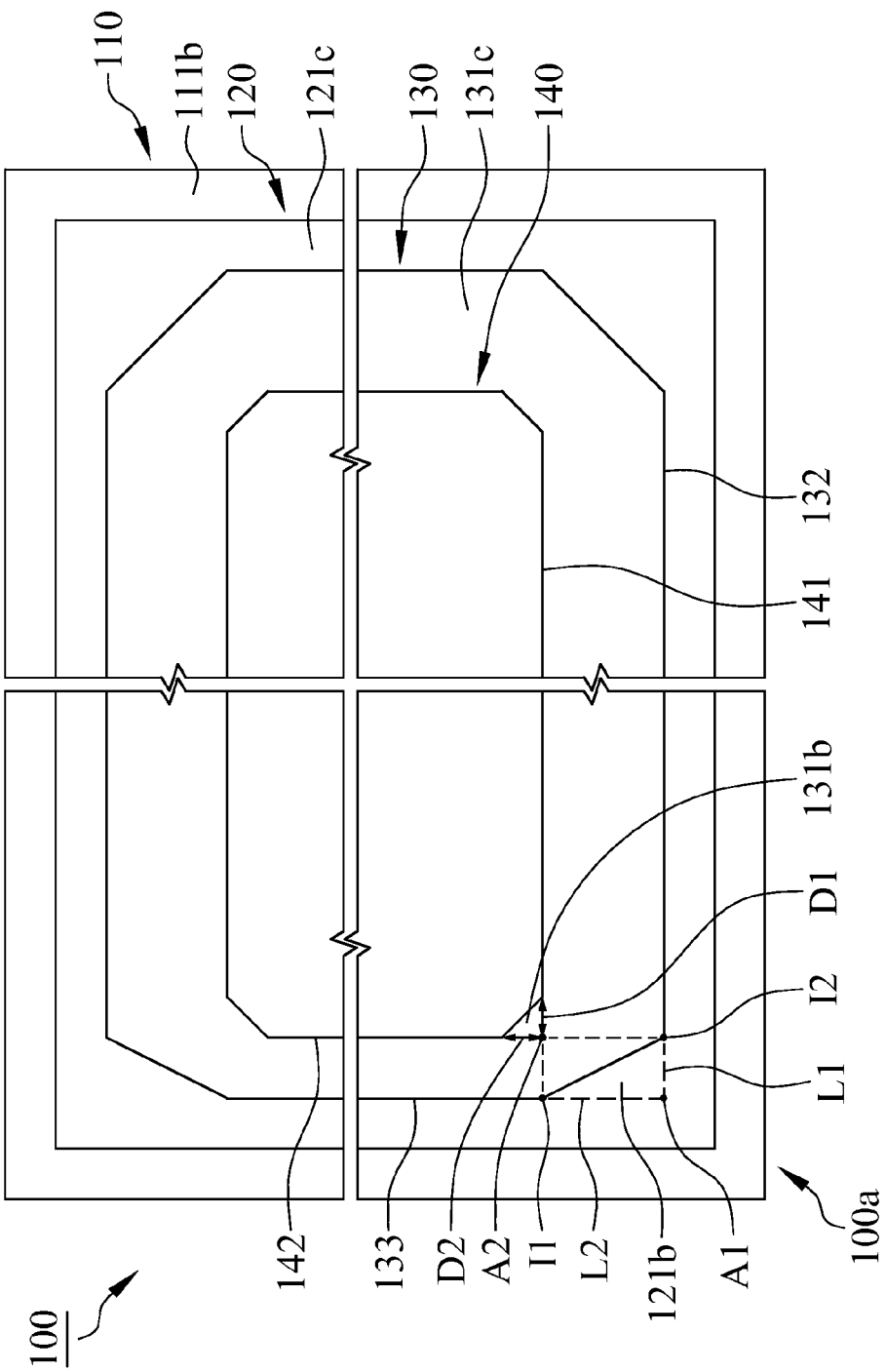
FIG. 3 is a top view illustrating the semiconductor structure in accordance with the first embodiment of the present invention.

With reference to FIGS. 2 and 3, the first lateral surface 132 comprises a first bottom edge 132a, the second lateral surface 133 comprises a second bottom edge 133a, wherein a first extension line L1 extendedly formed from the first bottom edge 132a intersects with a second extension line L2 extendedly formed from the second bottom edge 133a to form a first base point A1. In this embodiment, the first extension line L1 is perpendicular to the second extension line L2, and the first connection surface 134 is a flat surface.

With reference to FIGS. 1, 2 and 3, the third protective layer 140 is disposed at the second disposing zone 131a and reveals the at least one second anti-stress zone 131b. Besides, the third protective layer 140 comprises a third lateral surface 141, a fourth lateral surface 142 and a second connection surface 143 connected to the third lateral surface 141 and the fourth lateral surface 142, wherein the third lateral surface 141 comprises a third bottom edge 141a, and the fourth lateral surface 142 comprises a fourth bottom edge 142a. The third bottom edge 141a is projected on the first surface 121 of the first protective layer 120 to form a first projection line P1 situated on the first surface 121, wherein an extension line extended from the first projection line P1 intersects with the second bottom edge 133a of the second lateral surface 133 to form a first intersection point I1. The fourth bottom edge 142a is projected on the first surface 121 of the first protective layer 120 to form a second projection line P2 situated on the first surface 121, wherein an extension line extended from the second projection line P2 intersects with the first bottom edge 132a of the first lateral surface 132 to form a second intersection point I2. A zone formed by connecting the first base point A1, the first intersection point I1 and the second intersection point I2 is the at least one first anti-stress zone 121b. In this embodiment, the second connection surface 143 is a flat surface.

With reference to FIG. 2, the third bottom edge 141a of the third lateral surface 141 comprises a first point T1, and the fourth bottom edge 142a of the fourth lateral surface 142 comprises a second point T2. A third extension line L3 extendedly formed from the third bottom edge 141a intersects with a fourth extension line L4 extendedly formed from the fourth bottom edge 142a to form a second base point A2, and a zone formed by connecting the second base point A2, the first point T1 and the second point T2 is the at least one second anti-stress zone 131b. In this embodiment, a first distance D1 is spaced apart between the second base point A2 and the first point T1, a second distance D2 is spaced apart between the second base point A2 and the second point T2, and the first distance D1 is equal to the second distance D2.

In this invention, via the at least one first anti-stress zone 121b formed by connecting the first base point A1, the first intersection point I1 and the second intersection point I2, particularly, the first base point A1 formed by intersection between the first extension line L1 and the second extension line L2, the first intersection point I1 formed by intersection between the extension line of the first projection line P1 and the second bottom edge 133a, and the second intersection point I2 formed by intersection between the extension line of the second projection line P2 and the first bottom edge 132a, while the first protective layer 120, the second protective layer 130 and the third protective layer 140 are stackable to the carrier 110, the stress does not concentrate at the at least one corner 100a therefore preventing the at least one corner 100a of the semiconductor structure 100 from cracks or separations.

Figure 4:
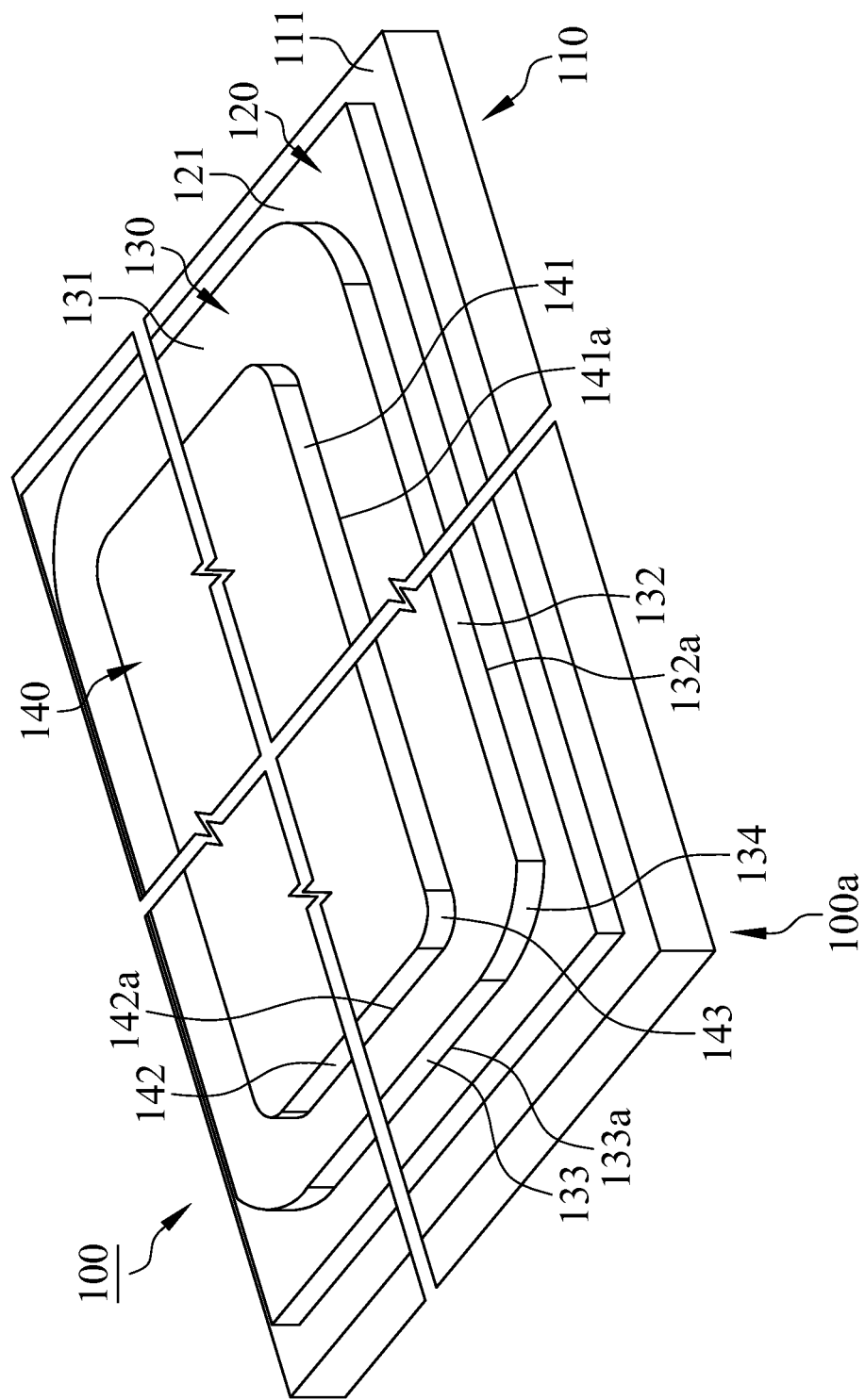
FIG. 4 is a perspective view illustrating a semiconductor structure in accordance with a second embodiment of the present invention.
Figure 5:
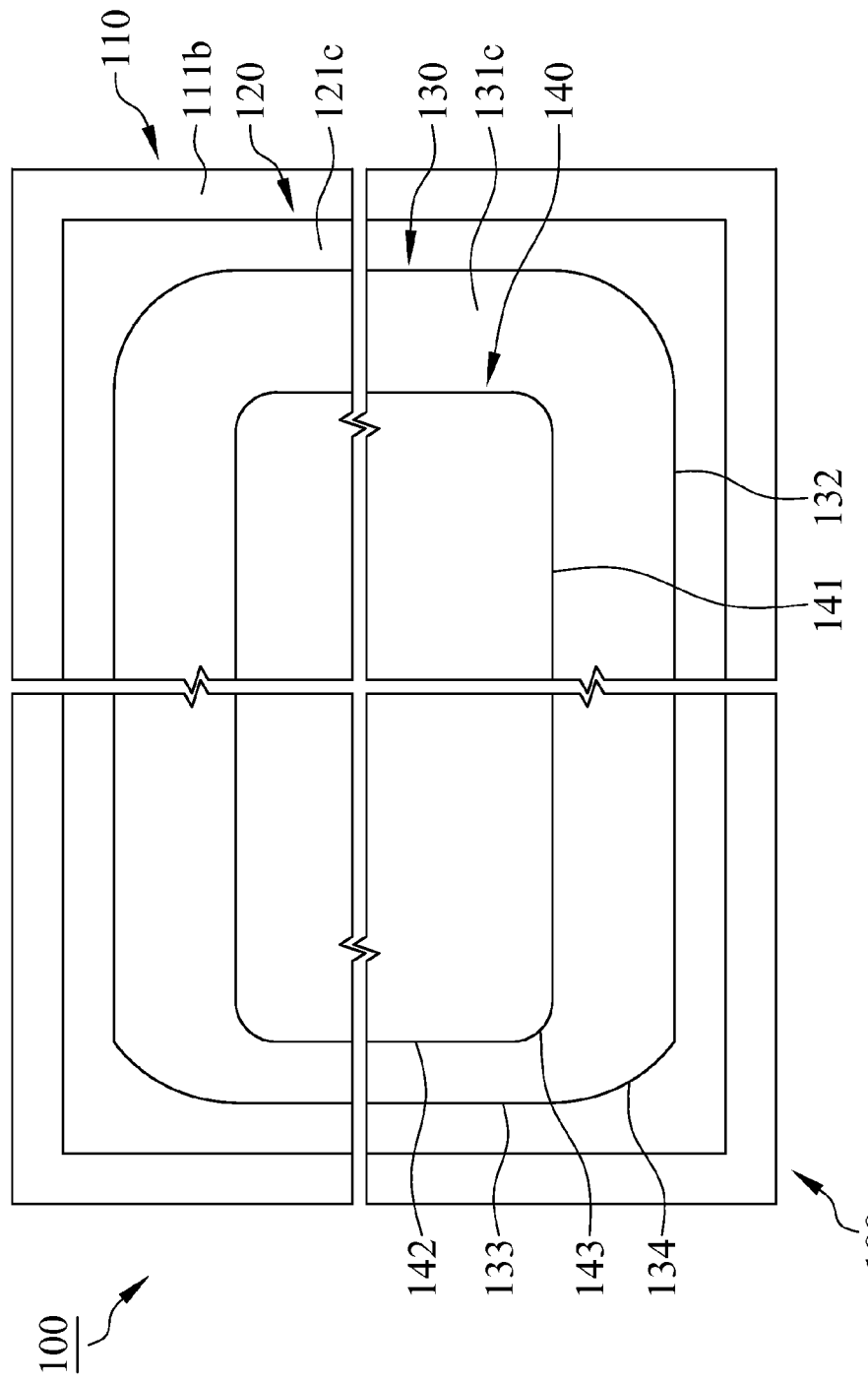
FIG. 5 is a top view illustrating the semiconductor structure in accordance with the second embodiment of the present invention.
Figure 6:
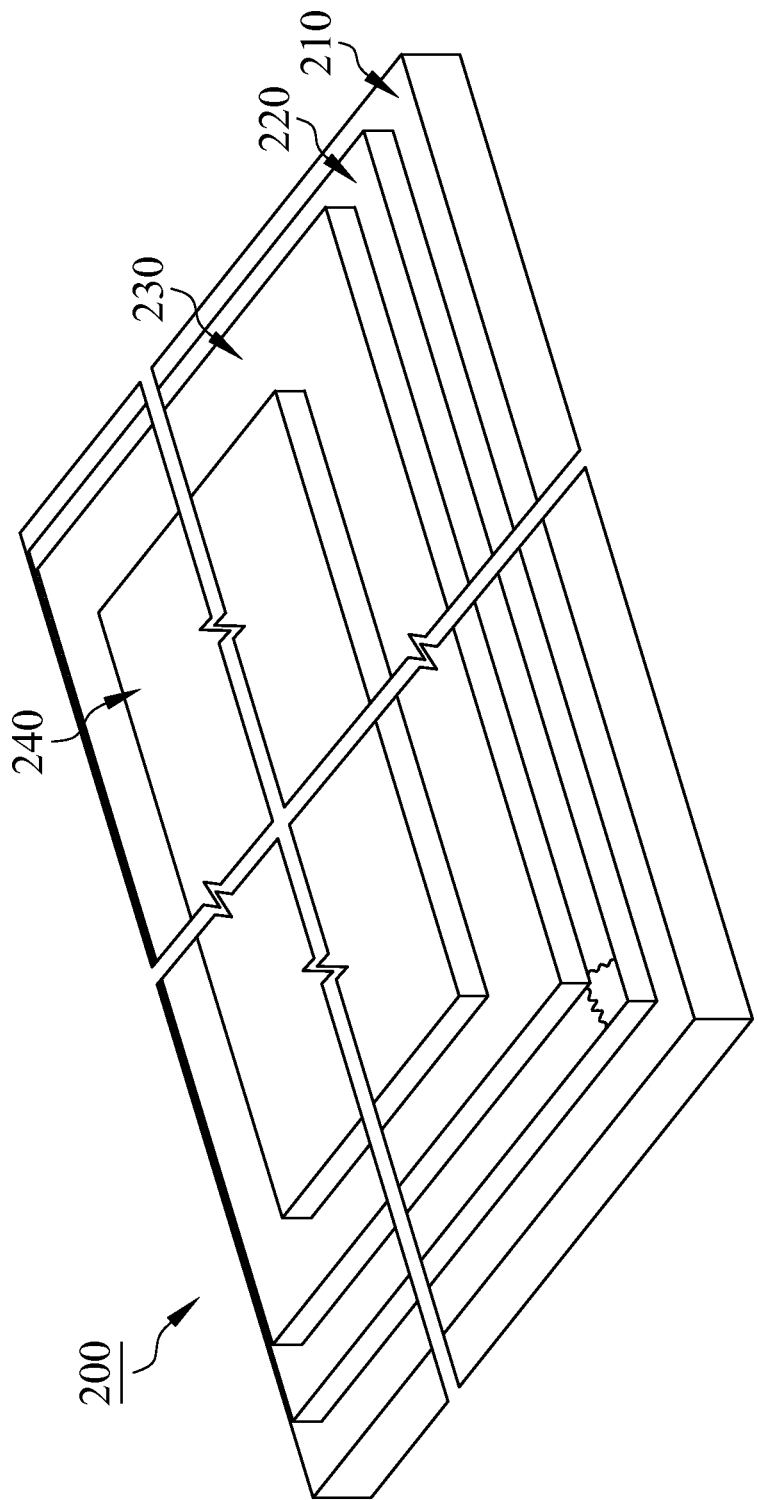
FIG. 6 is a perspective view illustrating a conventional semiconductor structure.

A semiconductor structure 100 is illustrated in FIGS. 4 and 5 according to a second embodiment of the present invention. The primary difference between the second embodiment and the first embodiment is that the first connection surface 134 and the second connection surface 143 are arc surfaces. The arc surfaces of the first connection surface 134 and the second connection surface 143 themselves also possess the function for preventing the stress of the semiconductor structure 100 from concentrating at the corner that is overlapped between the second protective layer 130 and the second protective layer 120 (adjacent to the at least one corner 100a). Therefore, cracks or separations likely occurred from the at least one corner 100a can be avoidable.

While this invention has been particularly illustrated and described in detail with respect to the preferred embodiments thereof, it will be clearly understood by those skilled in the art that it is not limited to the specific features and describes and various modifications and changes in form and details may be made without departing from the spirit and scope of this invention.

What is claimed is:

1. A semiconductor structure having at least one corner includes:
    a carrier having a carrier surface, the carrier surface comprises a protection-layered disposing zone and a protection-layered exposing zone located outside the protection-layered disposing zone;
    a first protective layer disposed at the protection-layered disposing zone and having a first surface, the first surface comprises a first disposing zone, at least one first anti-stress zone and a first exposing zone located outside the first disposing zone and the at least one first anti-stress zone, the at least one first anti-stress zone is located at the at least one corner;
    a second protective layer disposed at the first disposing zone and revealing the at least one first anti-stress zone and the first exposing zone, the second protective layer comprises a second surface, a first lateral surface and a second lateral surface, the second surface comprises a second disposing zone and a second exposing zone located outside the second disposing zone, the first lateral surface comprises a first bottom edge, the second lateral surface comprises a second bottom edge, wherein a first extension line extended from the first bottom edge intersects with a second extension line extended from the second bottom edge to form a first base point; and
    a third protective layer disposed at the second disposing zone and having a third lateral surface and a fourth lateral surface, the third lateral surface comprises a third bottom edge, the fourth lateral surface comprises a fourth bottom edge, wherein the third bottom edge is projected on the first surface of the first protective layer to form a first projection line situated on the first surface, an extension line of the first projection line intersects with the second bottom edge of the second lateral surface to form a first intersection point, wherein the fourth bottom edge is projected on the first surface of the first protective layer to form a second projection line situated on the first surface, an extension line of the second projection line intersects with the first bottom edge of the first lateral surface to form a second intersection point, and a zone formed by connecting the first base point, the first intersection point and the second intersection point is the at least one first anti-stress zone.

2. The semiconductor structure in accordance with claim 1, wherein the first extension line is perpendicular to the second extension line.

3. The semiconductor structure in accordance with claim 1, wherein the second surface of the second protective layer further comprises at least one second anti-stress zone located at a corner of the second disposing zone, the second exposing zone is located outside the at least one second anti-stress zone, the third protective layer reveals the at least one second anti-stress zone, the at least one second anti-stress zone and the at least one first anti-stress zone are located at the at least one corner, and the area of the at least one first anti-stress zone is not smaller than that of the at least one second anti-stress zone.

4. The semiconductor structure in accordance with claim 3, wherein the third bottom edge of the third lateral surface comprises a first point, the fourth bottom edge of the fourth lateral surface comprises a second point, wherein a third extension line extended from the third bottom edge and a fourth extension line extended from the fourth bottom edge intersect to form a second base point, wherein a zone formed by connecting the second base point, the first point and the second point is the at least one second anti-stress zone.

5. The semiconductor structure in accordance with claim 4, wherein a first distance is spaced apart between the second base point and the first point, a second distance is spaced apart between the second base point and the second point, and the first distance is equal to the second distance.

6. The semiconductor structure in accordance with claim 1, wherein the second protective layer further comprises a first connection surface connected to the first lateral surface and the second lateral surface, and the first connection surface is a flat surface or an arc surface.

7. The semiconductor structure in accordance with claim 1, wherein the third protective layer further comprises a second connection surface connected to the third lateral surface and the fourth lateral surface, and the second connection surface is a flat surface or an arc surface.

* * * * *